(12) United States Patent
Lim et al.

(10) Patent No.: US 7,902,579 B2
(45) Date of Patent: Mar. 8, 2011

(54) MAGNETIC MEMORY DEVICES USING MAGNETIC DOMAIN DRAGGING

(75) Inventors: Chee-kheng Lim, Yongin-si (KR); Eun-sik Kim, Seoul (KR); Yong-su Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 716 days.

(21) Appl. No.: 11/505,969

(22) Filed: Aug. 18, 2006

(65) Prior Publication Data
US 2007/0194359 A1 Aug. 23, 2007

(30) Foreign Application Priority Data

Feb. 23, 2006 (KR) ................ 10-2006-0017876

(51) Int. Cl.
*G11C 11/02* (2006.01)
(52) U.S. Cl. ................ 257/295; 257/E21.665; 365/158
(58) Field of Classification Search ................ 257/295, 257/E21.665; 365/158; 368/158
See application file for complete search history.

(56) References Cited

U.S. PATENT DOCUMENTS

| 6,555,858 B1 | 4/2003 | Jones et al. | |
| 2002/0130339 A1* | 9/2002 | Kishi et al. | 257/295 |
| 2003/0090932 A1* | 5/2003 | Deak | 365/158 |
| 2003/0107849 A1* | 6/2003 | Ikarashi | 360/324.1 |
| 2003/0117837 A1* | 6/2003 | Park et al. | 365/158 |
| 2004/0252538 A1* | 12/2004 | Parkin | 365/80 |
| 2005/0041463 A1* | 2/2005 | Drewes | 365/158 |
| 2005/0136600 A1* | 6/2005 | Huai | 438/296 |
| 2006/0028863 A1 | 2/2006 | Chung et al. | |
| 2006/0221677 A1* | 10/2006 | Klaeui et al. | 365/158 |
| 2007/0242505 A1* | 10/2007 | Ochiai et al. | 365/171 |

FOREIGN PATENT DOCUMENTS

| EP | 1 320 102 A2 | 6/2003 |
| EP | 1 708 257 A1 | 10/2006 |
| WO | WO 2005/069368 A1 | 7/2005 |

OTHER PUBLICATIONS

Chinese Office Action dated Mar. 6, 2009 for corresponding Chinese Application No. 200610121657.9 and English translation thereof.
European Search Report and Written Opinion (dated Jun. 12, 2007) for counterpart European Application No. EP 06 11 8905 is provided for the purpose of certification under 37 C.F.R. § 1.97 (e).

* cited by examiner

*Primary Examiner* — Wael M Fahmy
*Assistant Examiner* — Abul Kalam
(74) *Attorney, Agent, or Firm* — Harness, Dickey & Pierce, PLC

(57) ABSTRACT

A magnetic memory device includes a memory region, an input and a sensor. The memory region includes a free layer, a pinned layer and a non-magnetic layer. The free layer has adjacent sectors and a magnetic domain wall. The pinned layer corresponds to the sectors and has a fixed magnetization direction. The non-magnetic layer is formed between the free layer and the pinned layer. The memory region includes a magnetic domain wall stopper for stopping the magnetic domain wall formed at each boundary of the sectors. The input is electrically connected to one end of the free layer for inputting a signal for magnetic domain dragging. The sensor measures a current flowing through the memory region.

22 Claims, 5 Drawing Sheets

MAGNETIC MEMORY DEVICES USING MAGNETIC DOMAIN DRAGGING

PRIORITY STATEMENT

This non-provisional U.S. patent application claims priority under 35 U.S.C. §119 to Korean Patent Application No. 10-2006-0017876, filed on Feb. 23, 2006, in the Korean Intellectual Property Office (KIPO), the entire contents of which is incorporated herein by reference.

BACKGROUND

Description of the Related Art

Magnetic random access memory (MRAM) is a type of non-volatile memory device. Related art MRAMs may include a transistor switching device and a magnetic tunnel junction (MTJ) cell for storing data. The MTJ cell includes a pinned ferromagnetic layer having a pinned or constant magnetization direction, and a free ferromagnetic layer having a magnetization direction that may change to be parallel or non-parallel to the magnetization direction of the pinned ferromagnetic layer. A non-magnetic layer may be disposed between the pinned ferromagnetic layer and the free ferromagnetic layer. Related art MRAMs may have limited data storage capacity because each MTJ cell stores only a single bit of data.

SUMMARY

Example embodiments relate to magnetic memory devices, for example, magnetic memory devices capable of reading and/or writing multi-bit data using magnetic domain dragging. At least one example embodiment provides a magnetic memory device capable of storing data of a plurality of states by positioning a magnetic domain wall formed at a free layer of the memory device using magnetic domain dragging.

According to at least one example embodiment, a magnetic memory device may include a memory region. The memory region may include a free layer having adjoined sectors in which a magnetic domain wall may be formed. A pinned layer may be formed to correspond to the sectors and may have a fixed magnetization direction. A non-magnetic layer may be formed between the free layer and the pinned layer. A magnetic domain wall stopper for stopping the magnetic domain wall may be formed at each boundary between the sectors. The magnetic memory device may further include an input part or port electrically connected to an end of the free layer for inputting a dragging signal for magnetic domain dragging, and a sensor or sensing part for measuring current flowing through the memory region.

In at least some example embodiments, the magnetic domain wall stopper may be a pinning groove formed at the boundary of each sector. Each pinning groove may be a pair of pinning grooves formed facing each other at the boundary between each sector. The sector may be trapezoidal in shape, and the magnetic domain wall stopper may be a boundary line formed where a short side of one sector and a long side of an adjacent sector meet. Both ends of the free layer may have a sharp shape. For example, both ends of the free layer may be pointed or have a pointed shape.

In at least some example embodiments, a length of each sector may be greater than a length of the magnetic domain wall. The magnetic memory device may include a bit line connected to one end of the free layer and a transistor connected to another end of the free layer.

BRIEF DESCRIPTION OF THE DRAWINGS

Example embodiments will be described in more detail with reference to the attached drawings in which.

DETAILED DESCRIPTION OF EXAMPLE EMBODIMENTS

Figure 1:
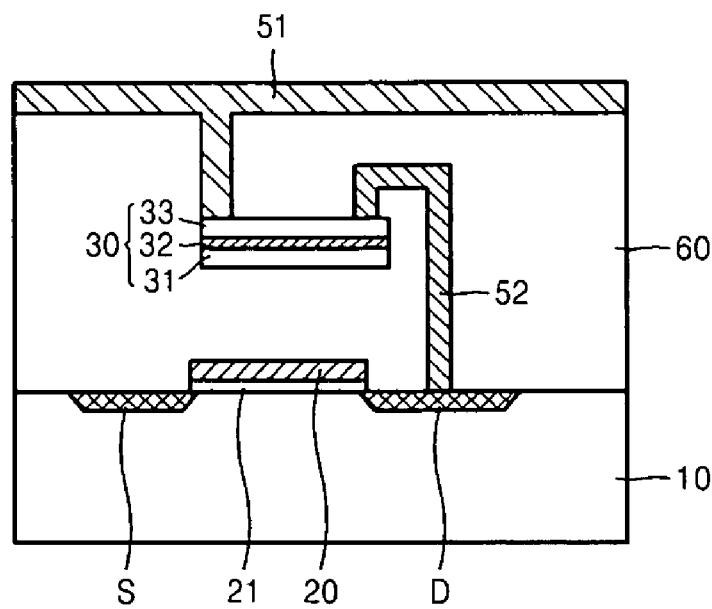
FIG. 1 is a cross-sectional view of a magnetic memory device, according to an example embodiment of the present invention.

Various example embodiments will now be described more fully with reference to the accompanying drawings in which some example embodiments of the invention are shown. In the drawings, the thicknesses of layers and regions are exaggerated for clarity.

Detailed illustrative example embodiments are disclosed herein. However, specific structural and functional details disclosed herein are merely representative for purposes of describing example embodiments of the present invention. This invention may, however, may be embodied in many alternate forms and should not be construed as limited to only the example embodiments set forth herein.

Accordingly, while example embodiments are capable of various modifications and alternative forms, example embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular example embodiments only and is not intended to limit the example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed, concurrently, substantially concurrently or executed in the reverse order, depending upon the functionality/acts involved.

FIG. 1 is a cross-sectional view of a magnetic memory device, according to an example embodiment.

Referring to FIG. 1, a source S and a drain D doped with impurities may be formed in a substrate 10. A gate oxide film 21 and a gate electrode 20 may be stacked (e.g., sequentially stacked) between the source S and the drain D on a portion of the substrate 10. A memory region 30 for storing data may be formed above the gate electrode 20. An upper portion of the memory region 30 may have one end electrically connected to a bit line 51 and another end electrically connected to the drain D via a conducting line 52.

The memory region 30 may be formed of, for example, a giant-magneto-resistance (GMR) material; although any other suitable material may be used. The memory region 30 may include a pinned layer 31 having a fixed magnetization direction, a non-magnetic metal layer 32 formed on the pinned layer 31 and/or a free layer 33 formed on the non-magnetic metal layer 32. The free layer 33 may have a variable magnetization direction (e.g., a magnetization direction and that may be switched and/or may change). The non-magnetic metal layer 32 may be formed of, for example, copper (Cu) and may include a plurality of sectors. A magnetic domain wall DW (not shown in FIG. 1) may be formed in the free layer 33. The resistance of the memory region 30 may vary based on the position of the magnetic domain wall DW. Data may be represented using a change of resistance in the memory region 30. The magnetic memory device may further include an insulating layer 60.

Figure 2:
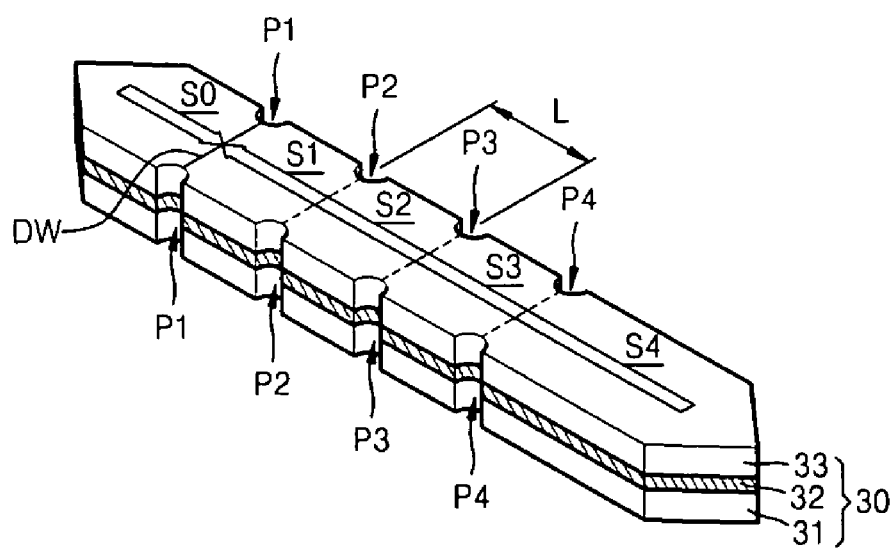
FIG. 2 is a perspective view of a memory region of a magnetic memory device, according to an example embodiment of the present invention.

FIG. 2 is a perspective view of a memory region, according to an example embodiment of the present invention. The memory region of FIG. 2 may be used as the memory region 30 in FIG. 1.

Referring to FIG. 2, a plurality of sectors (e.g., five) S0~S4 may be formed within the free layer 33. Pairs of pinning grooves P1~P4 may be formed at respective boundaries of the sectors. Sector S0 may be connected to bit line 51 and sector S4 may be electrically connected to the drain D. Two magnetic areas or magnetic domains may be formed facing each other at the free layer 33. At least one magnetic domain wall DW may be formed between the magnetic domains. The magnetic domain wall DW may be positioned (e.g., variably positioned) at a magnetic domain wall stopper. The magnetic domain wall stopper may include pairs of pinning grooves P1~P4.

The magnetic domain wall DW may be positioned at each of the pinning grooves P1, P2, P3 and P4, and each position of the magnetic domain wall DW may represent a (e.g., one) portion and/or piece of information. A magnetic domain having one magnetization direction may be formed at the pinned layer 31.

When a pulse current smaller than (e.g., having a magnitude less than) a critical current is applied to one end of the free layer 33, the magnetic domain wall DW may not move, but remain in a position located between one of the pairs of pinning grooves. On the other hand, when a pulse current greater than or equal to (e.g., having a magnitude larger than) or equal to the critical current is applied to the free layer 33, the magnetic domain wall DW may move from between one pair of pinning grooves, where the magnetic domain wall DW has been located prior to the application of the pulse current, to between a pair of adjacent pinning groove. The direction in which the magnetic domain wall DW moves may be determined by the direction of the pulse current. The critical current may be determined, for example, according to the shape of the pinning groove.

Ends of the sectors S0 and S4 may be tapered to a point in order to suppress (e.g., prevent) other magnetic domain walls DW from forming at sectors S0 and S4.

A length of the magnetic domain wall DW may vary depending on the magnetic material used to form the free layer 33. For example, the length of the magnetic domain wall DW may range from about 30 nm to about 80 nm, inclusive. In at least some example embodiments, a length L, which represents the minimum length of each sector, may be longer than the length of the magnetic domain wall DW.

In example embodiments discussed herein, pinning grooves may be formed in pairs; however, example embodiments are not limited thereto. In least one example embodiment, each magnetic domain wall stopper may be formed of one pinning groove or a plurality (e.g., two or more) pinning grooves.

Figure 3:
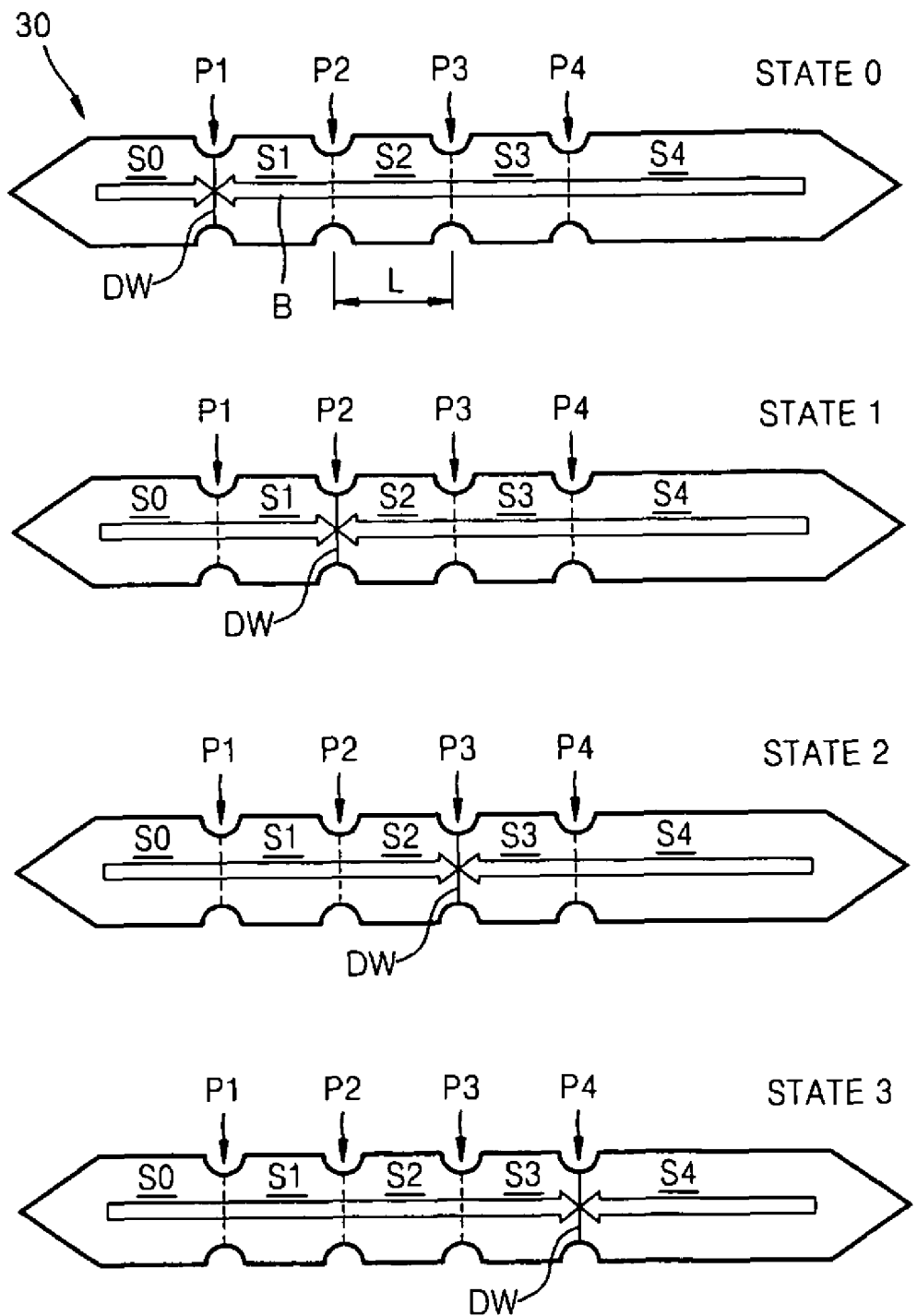
FIG. 3 is a series of diagrams illustrating the dependence of the resistance of the memory region shown in FIG. 2 on the position of a magnetic domain wall, according to an example embodiment of the present invention.

FIG. 3 is a series of diagrams illustrating the resistance dependence of the memory region 30 of FIG. 2 on the position of the magnetic domain wall DW position according to an example embodiment.

Referring to FIG. 3, in each of the plurality of states STATE 0~3, the magnetic domain wall DW may be positioned between one of the pairs of pinning grooves P1~P4 of the free layer 33. As shown in FIG. 3, in STATE 0, when the magnetization direction of the pinned layer 31 corresponding to the sectors S1~S3 is in a direction indicated by arrow B, the magnetization direction of the free layer 33 contained in the memory region 30 may be parallel to the magnetization direction of pinned layer 31, and the resistance of the memory region 30 may be reduced (e.g., to a minimum).

In STATE 1, the magnetic domain wall DW may be positioned between the pair of pinning grooves P2, the magnetization direction of the free layer 33 in sectors S0 and S1 may be different from the magnetization direction of the free layer 32 in sectors S2, S3 and S4. For example, in sectors S0 and S1, the magnetization direction of the free layer 33 may be different from the magnetization direction of the pinned layer 31, and in sectors S2 and S3 the magnetization direction of the free layer 33 may be the same as the magnetization direction of the pinned layer 31.

As the memory region 30 changes from STATE 1 to STATE 2 and to STATE 3, the magnetic domain wall DW may move to from left to right in FIG. 3. Accordingly, the region having a magnetization direction different from the magnetization direction of the free layer 33 may increase. This may increase the resistance of the memory region 30.

Because the resistance of the memory region 30 changes based (or depending) on the position of the magnetic domain wall DW, which of states STATE 0~3 the memory region 30 is in may be determined by measuring the current flowing through the memory region 30. An information storage device may be realized by writing and/or reading states of in the memory region 30.

A method of operating the magnetic memory device, according to an example embodiment, will now be described in more detail.

Figure 4A:
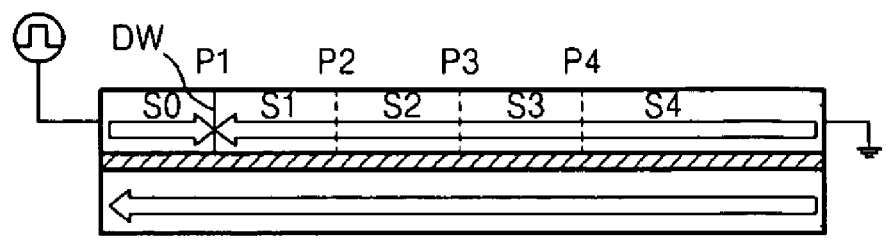
FIG. 4A through 4C are diagrams illustrating an operating method of a magnetic memory device, according to an example embodiment of the present invention.
Figure 4B:
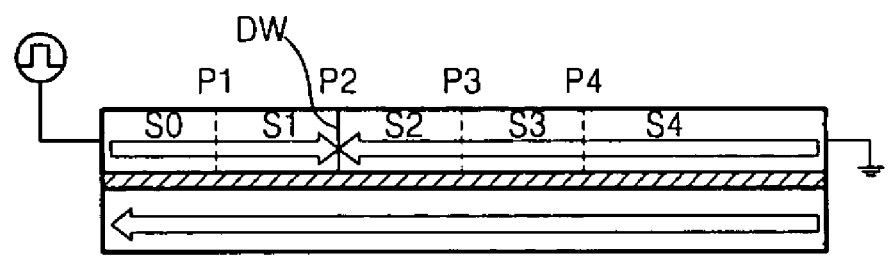
Figure 4C:
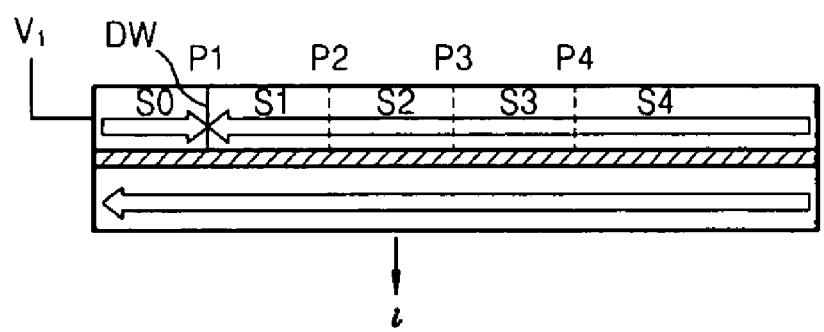

FIG. 4A through 4C illustrate an operating method of a magnetic memory device, according to an example embodiment. Referring to FIG. 4A, the magnetic domain wall DW may be positioned at the pinning groove P1 in the memory region 30. In this position, resistance of the memory region 30 may be reduced (e.g., to a minimum) because the magnetization direction of the sectors S1~S3 is the same as the magnetization direction of the pinned layer 31.

When a positive pulse current greater than or equal to a critical current (e.g., magnetic drain dragging pulse current) and that overcomes the pinning groove P1 is applied to an input end of the free layer 33, the magnetic domain wall DW may move from left to right in FIG. 4B. The duration of the pulse current may range from about 0.2 ns to about 1.0 ns, inclusive. The duration may vary depending on the length of the sector. The critical current may vary depending on the shape of the pinning groove.

When a negative pulse current great than or equal to the critical current is applied to the input end of the free layer 33, the magnetic domain wall DW may move from right to left in FIG. 4B. In this example, the magnetic domain wall DW may be moved by applying a positive or negative pulse current to the input end of the free layer 33. This example process may correspond to a writing process.

Referring back to FIG. 1, the information or data writing process may address a memory region 30 by applying a positive current greater than or equal to the critical current to the bit line 51 connected to the input end of the free layer 33 and applying a voltage greater than or equal to a threshold voltage at the gate electrode 20 of a transistor. The bit line 51 may serve as an input for inputting a dragging signal used for magnetic domain dragging.

A method of reading information stored in the memory region 30, according to an example embodiment, will now be described with regard to FIG. 4C. Referring to FIG. 4C, a voltage may be applied to the input end of the free layer 33, and current flowing through the memory region 30 may be measured. Because resistance of the memory region 30 may be calculated from the measured current, information stored in the memory region 30 may be read using the measured current.

Referring back to FIG. 1, a memory region 30 may be addressed by applying a voltage to the bit line 51 and the gate electrode 20. A current flowing through the memory region 30 may be measured using a sensor (or sensing part, not shown) connected to the source electrode S. The sensor may be, for example, a galvanometer or ammeter.

Figure 5:
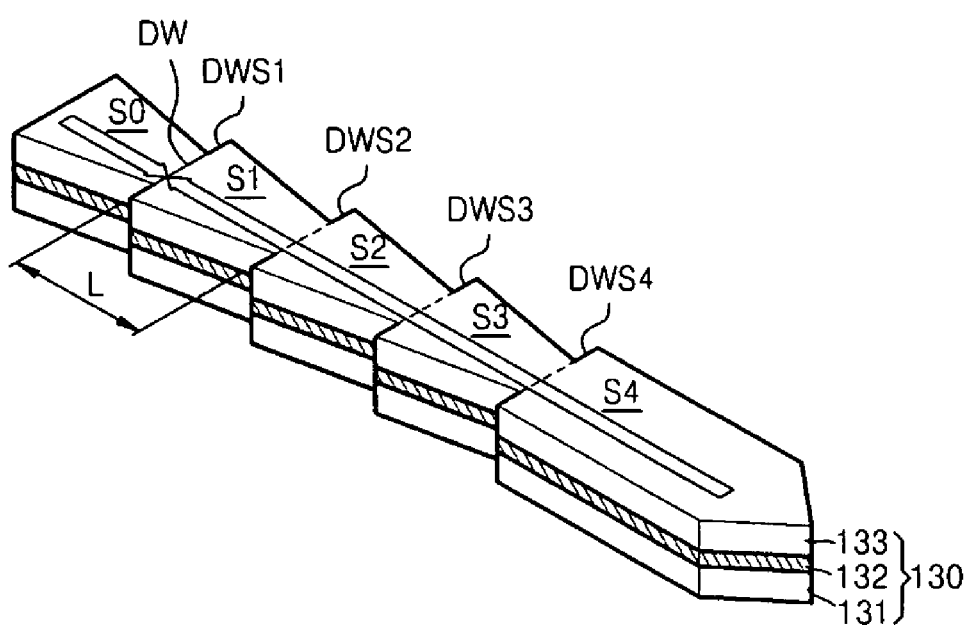
FIG. 5 is a perspective view of a memory region, according to another example embodiment of the present invention.

FIG. 5 is a perspective view of a memory region (e.g., memory region 130), according to another example embodiment.

Referring to FIG. 5, sectors S0~S4 may be formed in a free layer 133, and sensor magnetic domain wall stoppers DWS1~DWS4 may be formed between sectors S0~S4. Sectors S0~S3 may have a trapezoid shape including shorter and longer sides in parallel. A portion where the shorter side of a sector (e.g., S1) contacts the longer side of another sector (e.g., S2) may correspond to a magnetic domain wall stopper (e.g., DWS2).

The sector S0 may be connected to the line 51 (as shown in FIG. 1), and the sector S4 may be electrically connected to the drain D (as shown in FIG. 1). Two magnetic domains may be formed facing each other at the free layer 133, and a magnetic domain wall DW may be formed. Each positioning of the magnetic domain wall DW at magnetic domain wall stoppers DWS1, DWS2, DWS3 and DWS4 may represent at least one piece of information. A magnetic domain having a fixed magnetization direction may be formed in a region corresponding to sectors S0~S4 at pinned layer 131.

When a pulse current less than a critical current is applied to an input end of the free layer 133, the magnetic domain wall DW may not pass through the stopper and may not move. On the other hand, when a pulse current greater than or equal to the critical current is applied to the input end of the free layer 133, the magnetic domain wall DW may pass through the stopper and stop at an adjacent stopper. Because a region of the longer side has a higher energy than that of the shorter side in a sector, after entering a sector the magnetic domain wall DW may move toward the stopper position, which may be the position of the shorter side having a lower energy. The magnetic domain wall may stop at the shorter side of the sector.

The length of the magnetic domain wall DW may vary depending on the magnetic material used to form the free layer 33, and may range from about 30 nm to about 80 nm, inclusive. A length L, which may be the length of at least one or all sectors, may be longer than the length of the magnetic domain wall DW according to an example embodiment.

Figure 6:
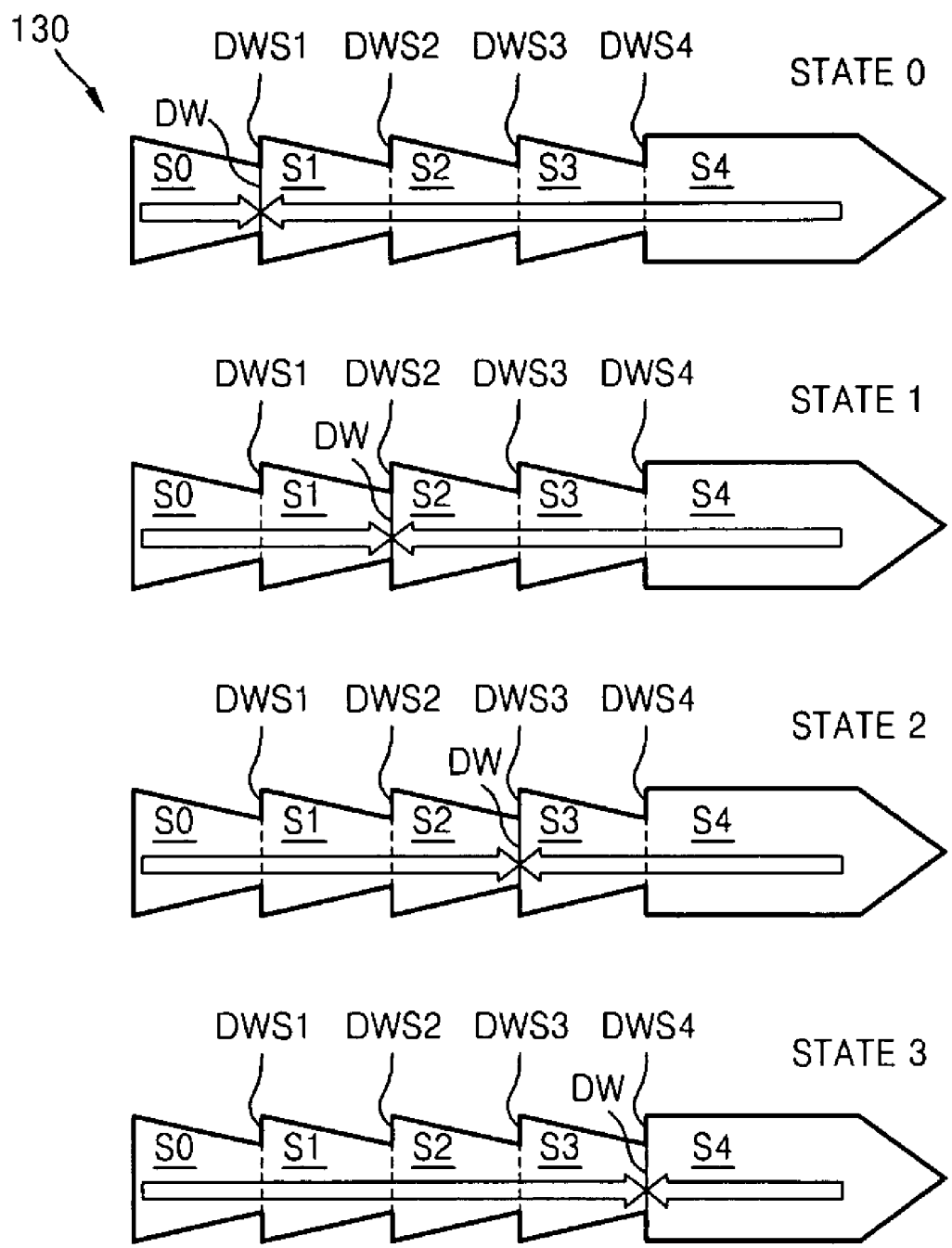
FIG. 6 is a series of diagrams illustrating the dependence of the resistance of the memory region as shown in FIG. 5 on the position of a magnetic domain wall, according to an example embodiment of the present invention.

FIG. 6 is a series of diagrams illustrating a dependence of the resistance of the memory region 130 on the position of a magnetic domain wall DW.

Referring to FIG. 6, in states STATE 0~3, the magnetic domain wall DW may be positioned at one of the magnetic domain wall stoppers DWS1~DWS4 in the free layer 133. When the magnetization direction of the pinned layer 131 corresponding to the sectors S0~S4 is in the direction indicated by arrow B, at least some (e.g., most) sectors (e.g., S1~S4) may have magnetization directions of the free layer 133 in the memory region 130 for STATE 0 may be the same as the pinned layer 131, and the resistance of the memory region 130 may be lower or relatively low (e.g., at a minimum).

In STATE 1, the domain wall DW may be positioned at the magnetic domain wall stopper DWS2, and the magnetization direction of sectors S0 and S1 may be different from the magnetization direction of the pinned layer 131. Accordingly, the resistance of the memory region in STATE 1 may be larger than the resistance of the memory region in STATE 0.

As the memory region 130 changes from STATE 1 to STATE 2 and to STATE 3, the magnetic domain wall DW may move from left to right in FIG. 6. The region having a magnetization direction different from the magnetization direction of the free layer 133 may increase, which may increase the resistance of the memory region 130.

Because the resistance of the memory region 130 depends on the position of the magnetic domain wall DW, determining which of states STATE 0~3 the memory region 130 is in may be determined by measuring the amount of current flowing through the memory region 130 due to an applied voltage. Therefore, an information storage apparatus may be realized by writing and/or reading the STATEs 0~3 in the memory region 130.

The method of writing information on the memory region and reading the information, according at least the example embodiment illustrated in FIGS. 2-4, may be the same or substantially the same as the example method shown in FIGS. 5 and 6, and therefore, detailed descriptions thereof will be omitted for the sake of brevity.

As described above, magnetic memory devices using magnetic domain dragging, according to at least some example embodiments may be used to store multi-bit data (e.g., a number of pieces of information or data), the number being the same or substantially the same as the number of magnetic drain wall stoppers formed in a memory region.

Magnetic memory devices, according to at least some example embodiments, may increase data storage capacity. Accordingly, the magnetic device such as the MRAM having an increased data storage capacity may be realized using example embodiments.

Although discussed herein as being comprised of copper Cu, the non-magnetic metal layer may be formed of any suitable metallic material.

While the present invention has been particularly shown and described with reference to example embodiments thereof, it will be understood by those of ordinary skill in the art that various changes in form and details may be made therein without departing from the spirit and scope of the present invention as defined by the following claims, and the present invention is not limited to the example structures and arrays illustrated herein.

What is claimed is:

1. A memory region comprising:
   a free layer having a plurality of adjacent sectors in which a single magnetic domain wall is formed, each adjacent sector being separated by a magnetic domain stopper for stopping the single magnetic domain wall;
   a non-magnetic layer formed adjacent to the free layer; and
   a pinned layer formed adjacent to the non-magnetic layer and having a fixed magnetization direction; wherein
   the free layer is configured to store multi-bit data according to the position of the single magnetic domain wall among the magnetic domain stoppers separating the plurality of adjacent sectors.

2. The memory region of claim 1, wherein each magnetic domain wall stopper is a pinning groove formed at a respective boundary between two adjacent sectors.

3. The memory region of claim 2, wherein each pinning groove is a pair of pinning grooves formed facing each other.

4. The memory region of claim 1, wherein each of the plurality of sectors has a trapezoid shape, and the magnetic domain wall stopper is formed where a shorter side of one sector and a longer side of an adjacent sector meet.

5. The memory region of claim 1, wherein both ends of the free layer are tapered to a point.

6. The memory region of claim 1, wherein a length of each sector is greater than a length of the single magnetic domain wall.

7. The memory region of claim 1, wherein the non-magnetic layer is formed of metal.

8. The memory region of claim 1, wherein the non-magnetic layer is formed of Cu.

9. The memory region of claim 1, wherein the single magnetic domain wall has a length of about 30 nm to about 80 nm, inclusive.

10. A memory device comprising:
    the memory region of claim 1;
    an input electrically connected to an end of the free layer for inputting a signal; and
    a sensor for measuring current flow through the memory region.

11. The memory device of claim 10, wherein each magnetic domain wall stopper is a pinning groove formed at a respective boundary between two adjacent sectors.

12. The memory device of claim 11, wherein each pinning groove is a pair of pinning grooves formed facing each other.

13. The memory device of claim 10, wherein each of the plurality of sectors has a trapezoid shape and the magnetic domain wall stopper is formed where a shorter side of one sector and a longer side of an adjacent sector meet.

14. The memory device of claim 10, wherein both ends of the free layer are tapered to a point.

15. The memory device of claim 10, wherein a length of each sector is greater than a length of the single magnetic domain wall.

16. The memory device of claim 10, further comprising:
    a bit line connected to an end of the free layer; and
    a transistor connected to another end of the free layer.

17. The memory device of claim 16, wherein the input part is the bit line and the sensor is an ammeter connected to the transistor.

18. The memory device of claim 10, wherein the non-magnetic layer is formed of metal.

19. The memory device of claim 10, wherein the non-magnetic layer is formed at least partly of Cu.

20. The memory device of claim 10, wherein the single magnetic domain wall has a length of about 30 nm to about 80 nm, inclusive.

21. The memory region of claim 1, wherein the number of adjacent sectors having a first magnetization direction and the number of adjacent sectors having a second magnetization direction depend on the position of the single magnetic domain wall among the magnetic domain stoppers separating the plurality of adjacent sectors.

22. The memory region of claim 1, wherein the pinned layer has a length at least equal to that of the free layer.

* * * * *